United States Patent [19]

Real

[11] Patent Number: 4,942,397
[45] Date of Patent: Jul. 17, 1990

[54] ELIMINATION OF LINEARITY SUPERPOSITION ERROR IN DIGITAL-TO-ANALOG CONVERTERS

[75] Inventor: Peter Real, North Andover, Mass.

[73] Assignee: Signal Processing Technologies, Inc., Colorado Springs, Colo.

[21] Appl. No.: 224,517

[22] Filed: Jul. 26, 1988

[51] Int. Cl.⁵ .............................................. H03M 1/06
[52] U.S. Cl. ..................................... 341/118; 341/154
[58] Field of Search ................................. 341/118, 154

[56] References Cited

U.S. PATENT DOCUMENTS

| | | | |
|---|---|---|---|
| 4,398,207 | 8/1983 | Hoff, Jr. et al. | 357/51 |
| 4,521,765 | 6/1985 | Wang et al. | 340/347 |
| 4,567,463 | 1/1986 | Naylor | 340/347 |
| 4,583,009 | 4/1986 | Eng, Jr. | 307/297 |
| 4,641,194 | 2/1987 | Hinn | 358/242 |
| 4,701,641 | 10/1987 | Harris et al. | 307/445 |

OTHER PUBLICATIONS

Honeywell Signal Technologies Data Sheet for the HDAC 50800 Digital-to-Analog Converter.

*Primary Examiner*—William M. Shoop, Jr.
*Assistant Examiner*—Marc S. Hoff
*Attorney, Agent, or Firm*—Sheridan, Ross & McIntosh

[57] ABSTRACT

A converter, of the type having an R-2R resistive network and switches, is used to convert a digital signal of n-bits into an analog signal. A plurality of first interconnectors is used to electrically connect a first switch input of one of the switches to a first voltage reference node by separately extending directly therebetween. A plurality of second interconnectors is used to electrically connect a second switch input on the same one of the switches to a second voltage reference node is a similar fashion.

9 Claims, 3 Drawing Sheets

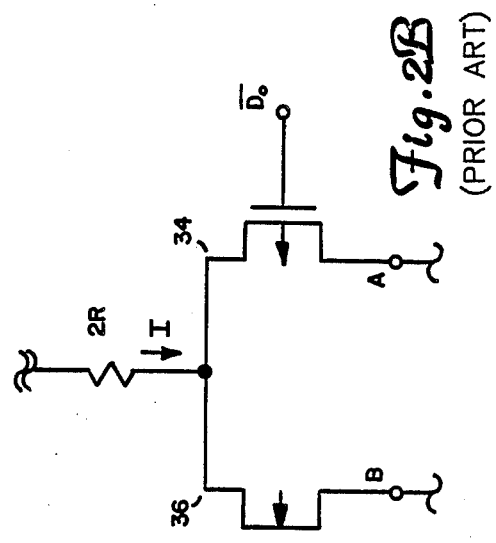
*Fig. 2B* (PRIOR ART)
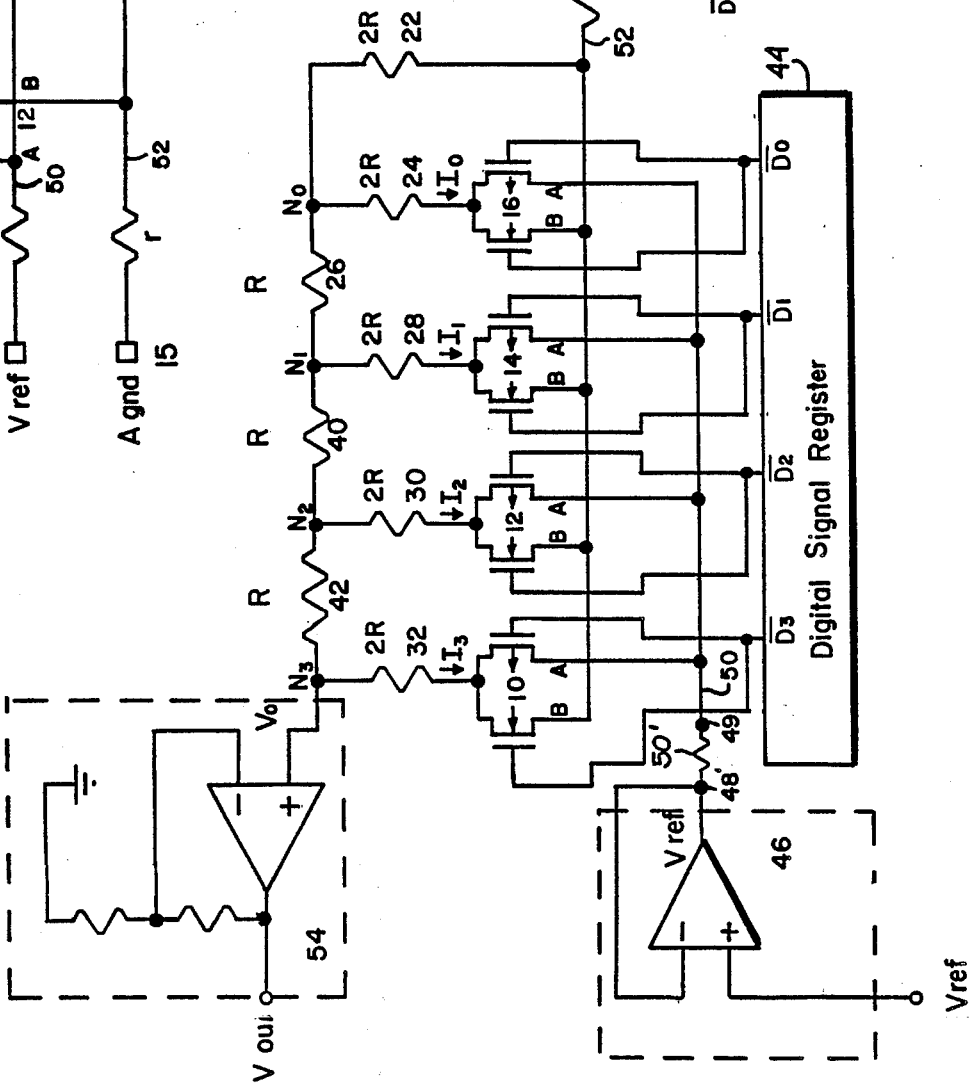
*Fig. 2A* (PRIOR ART)
*Fig. 2* (PRIOR ART)

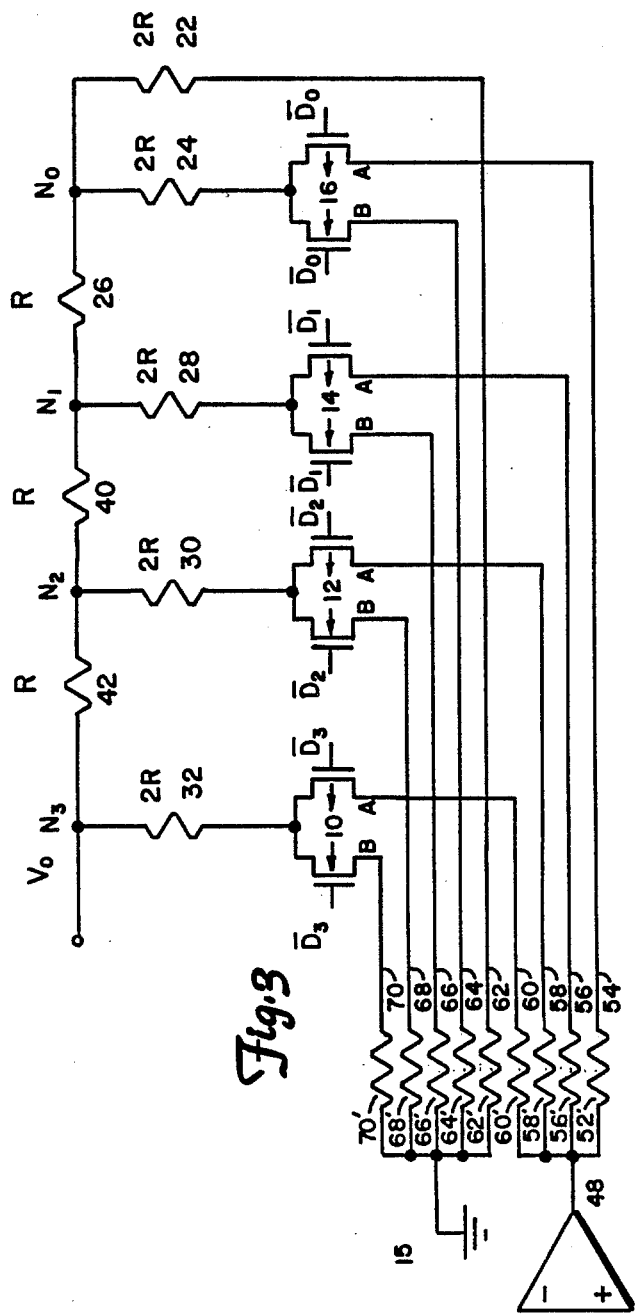
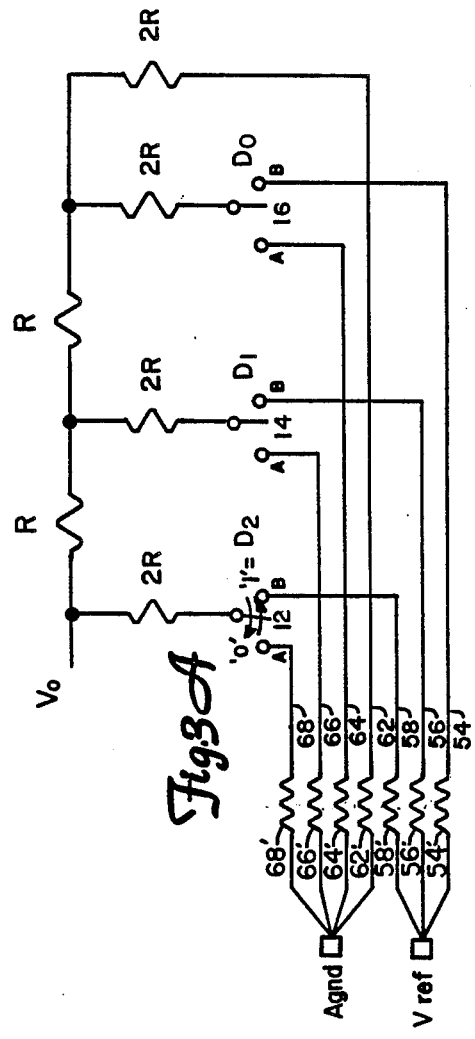

ELIMINATION OF LINEARITY SUPERPOSITION ERROR IN DIGITAL-TO-ANALOG CONVERTERS

BACKGROUND OF THE INVENTION

1. Field of the Invention.

This invention relates to eliminating errors in digital-to-analog converters. More particularly, this invention relates to a significant reduction or elimination of linearity superposition errors due to reference and ground line resistance in a D/A converter/system using a voltage-output resistor ladder network.

2. Description of the Prior Art.

Analog-to-digital (A/D) and digital-to-analog (D/A) converters are important because they allow digital systems, such as digital computers, to interact with the physical world. Generally, a digital-to-analog converter accepts, at its input, a number which is represented, in binary form, by digital signals. The D/A converter then produces an analog output which represents the digital input. The conversion is usually done by weighting currents, using a resistive ladder network, according to the significance they represent in the digital input. These weighted currents are then summed in an operational amplifier, the output of which is the analog representation of the digital input.

A portion of a typical D/A converter is shown in FIG. 1. In FIG. 1, digital information which is to be converted is represented by binary bits (not shown). Each bit is represented by a signal, as indicated above, which controls the operation of one of switches 10, 12, 14 or 16. If a bit is 0, the switch that it in effect controls will be in the position shown in FIG. 1. If the bit is 1, the switch will be in the position opposite those shown in FIG. 1. For example, if the binary bit which controls switch 10 were a 1, switch 10 would be in the position shown by dotted line 18.

However, no matter what position switches 10, 12, 14 and 16 are in, they are at ground reference potential either directly at node 15, as shown in FIG. 1, or through the virtual ground of op-amp 20 at node 48 when they are in the opposite switch position. Therefore, the magnitude of currents I0, I1, I2 and I3 are essentially independent of the positions of corresponding switches 16, 14, 12 and 10. Since the binary digital signals which represent the bits to be converted (not shown) control switches 16, 14, 12 and 10, it follows that the magnitude of currents I0, I1, I2 and I3 are also independent of the state of the bits which in effect control switches 10 through 16 (whether they are a 0 or a 1). Hence, the voltages at nodes N0, N1, N2 and N3 can easily be calculated.

Since it appears at node N0 that two parallel resistors 22 and 24, each with a resistance value of approximately 2R, are effectively connected in parallel between N0 and ground, and one resistor 26 with a resistance value of about R is connected between node N0 and node N1, the value of the voltage at node N0 must be half of the value of the voltage at node N1 due to the voltage divider formed by resistor 26 and the parallel combination of resistors 22 and 24. Following this analysis from node to node, it can be shown that the value of the voltage at node N0 equals VREF/8, at node N1 the voltage equals VREF/4, at node N2 the voltage equals VREF/2, and at node N3 the voltage equals VREF (the same analysis is true for any extension of the ladder network).

Thus, one can see that currents I0, I1, I2 and I3 are weighted so as to be monotonically increasing fractions of the reference current IREF with each twice the value of the preceding one. Also, Iop is comprised of the sum of just those of the weighted currents I0, I1, I2 and I3 which correspond to a bit in the digital signal which is a 1. Hence, the output voltage VOUT of op-amp 20 is a value which represents the number to be converted.

Often, switches 10, 12, 14 and 16 are comprised of coupled n-channel MOS transistors as shown in FIG. 1A. Transistors 34 and 36 each have the drain thereof jointly coupled to the bottom terminal of one of the 2R value resistors 24, 28, 30 or 32 in FIG. 1. The source of transistor 36 would be typically connected to ground node 15, and the source of transistor 34 would typically be connected to virtual ground node 48. The gate terminals of MOS transistors 34 and 36 are coupled such that they receive the binary signals representing that bit which is controlling the switching of MOS transistors 34 and 36.

Logic signal D0 in FIG. 1A is applied to the gate terminal of MOS transistor 34, and its complement signal $\overline{D0}$ is applied to the gate terminal of MOS transistor 36. Therefore, if the binary state of bit signal D0 is 1 using positive logic, MOS transistor 34 is in the "on" condition and MOS transistor 36 is in the "off" condition. Likewise, if the binary state of bit signal D0 is 0, MOS transistor 36 is "on" and MOS transistor 34 is "off". If p-channel MOS transistors are used, the opposite transistor conditions will occur for these D0 digit signal logic values.

As indicated above, the value of the current I flowing through the resistor of value 2R in FIG. 1A is independent of the binary state of bit signal D0 controlling this switch. Similarly, the value of currents I0, I1, I2 and I3 in FIG. 1 are independent of the binary state of the bits which effectively control switches 16, 14, 12 and 10, respectively. Therefore, the value of IREF is constant and independent of interaction between the binary bits which control switches 10, 12, 14 and 16. Alternatively stated, a constant input impedance appears between node VREF and ground. The R and 2R valued resistors 22, 24, 26, 28, 30, 32, 40 and 42 in FIG. 1 can be trimmed to desired values by using laser trimming techniques. Also, the switching transistors, which make up switches 10, 12, 14 and 16, can be carefully scaled with respect to the resistance through them when they are in the "on" condition ($R_{ON}$). Since currents I0, I1, I2 and I3 are constant, using these techniques enables good performance with respect to absolute accuracy (a measure of each output current or voltage level with respect to its intended value), and relative accuracy (the accuracy of each analog output level as a fraction of the full-scale value).

Although the D/A converter of FIG. 1 can be made to operate quite accurately, capacitances are associated with the MOS transistors in switches 10, 12, 14 and 16. These capacitances slow the operation of the D/A conversion by lengthening the time required for VOUT to achieve the proper level of voltage. Leakages in the actual transistor switches used also cause difficulties as such leakage currents become error portions or the current Iop which determines the output voltage. For these reasons, a voltage-output D/A converter such as that shown in FIG. 2 is often used.

The structure, with respect to resistors 22, 24, 28, 30 and 32, each of a resistance value of approximately 2R, and with respect to resistors 26, 40 and 42, each of a resistance value of R, of the D/A converter shown in FIG. 2 is identical to that structure in the D/A converter shown in FIG. 1. The switching transistors 34 and 36, shown in typical form in FIG. 2B, are a CMOS pair, and they have been repeatedly inserted in FIG. 2 in place of the simple switch models of switches 10, 12, 14 and 16 shown in FIG. 1.

The necessary switching effect can be obtained by applying a single bit signal $\overline{D0}$ to the gate terminals of two complementary MOS transistors as shown in FIG. 2B without needing its complement. In FIG. 2B, n-channel MOS transistor 36 is coupled at its drain to the drain of p-channel MOS transistor 34. The drains of complementary MOS transistors 34 and 36 are also coupled to one of the 2R valued resistors 24, 28, 30 or 32, as discussed above. The sources of the complementary MOS transistors 34 and 36 are switch terminals A and respectively. As before, switch terminals A are typically connected to reference voltage node 48', and switch terminals B are typically connected to ground reference node 15. Due to MOS transistor 36 being n-channel and MOS transistor 34 being p-channel, applying $\overline{D0}$ to the gates of both MOS transistors 34 and 36 achieves the switching effect of having one in the "on" condition and the other in the "off" condition because opposite gate voltage logic levels are required at the gate of each to achieve the same transistor conduction condition.

Also, the digital binary signal source which effectively controls switches 10, 12, 14 and 16, is explicitly shown in FIG. 2. The bit signals are shown taken from digital signal register 44 with its outputs labeled with the bit signals supplied thereat, these being logic signals $\overline{D0}$ through $\overline{D3}$.

In the D/A converter of FIG. 2, the magnitude of the voltage which appears at output node V0 varies with the state of digital logic signals D3 through D0. As any logic signal $D_N$ (or $D_{N-0}$), $D_{N-1}$, $D_{N-2}$, ..., $D_{N-n}$, $D_0$ (or $D_{N-N}$), here covering the range D3 through D0, becomes a "1", the voltage which appears at V0 increases by a fraction of the reference voltage appearing at the corresponding A terminals of switches 10 through 16. Each switch, on having its controlling digit signal $D_{N-n}$ take a logical value of "1", can be shown to provide an increase of $(\frac{1}{2})^{n+1}$ VREF. For instance, if the binary code representing D3, D2, D1 and D0 were 1000, V0=VREF/2 assuming a unity gain in the output amplifier. If it were 0100, V0=VREF/4. If it were 1100 V0=3VREF/4 and so forth. This manner of operation applies for any extension of the ladder network. Therefore, the voltage appearing at V0 is an analog reflection of the digit signals D0 through D3 as provided in complementary form at the outputs of digital signal register 44, the uncomplemented digit signals representing the digits or bits of the binary number to be converted.

Similar to the D/A converter shown in FIG. 1, ground terminal 15 in FIG. 2 is electrically connected to the B terminals (ground terminals) of switches 10, 12, 14 and 16 by a single track 52. Track 52 also has an inherent internal track resistance 52' associated with it, particularly if the circuit is implemented in a monolithic integrated circuit. The reference voltage VREF, rather than being applied to the junctions of resistors 32 and 42 as in FIG. 1, is now applied in FIG. 2 to node 48' by low output impedance reference voltage circuit 46, which is electrically connected by a single track 50 to the A terminals (voltage reference terminals) of switches 10, 12, 14 and 16. Track 50 also has an inherent internal track resistance 50' associated with it which will often be significant in a monolithic integrated circuit.

Correspondingly, the output voltage $V_0$ in FIG. 2 appears at the junction of resistors 32 and 42, and is applied to a high impedance input of an output amplifier circuit 54. Arbitrary valued resistors are shown indicating gain is possible if desired, but a unity gain amplifier can also be used. Since the output voltage is taken at the junction of resistors 32 and 42 rather than from node 48', the capacitances associated with the MOS transistors in switches 10, 12, 14 and 16 do not appear between this output and ground. Therefore, those capacitances do not affect the rate at which V0 varies with respect to the number to be converted, and so the speed of the device is significantly enhanced.

However, there are also some disadvantages associated with the D/A converter of FIG. 2. Since a single track 50 electrically connects all the A terminals of switches 10, 12, 14 and 16 to voltage reference potential VREF at node 48, the amount of current flowing through track 50, and consequently through track resistance 50', is dependent on whether each of the MOS transistors in switches 10, 12, 14 and 16, associated with the A terminals, are in the "on" or "off" condition.

For instance, if all the MOS transistors in switches 10 through 16, associated with the A terminal, are "on", a different current will flow through track 50 than would flow if only the MOS transistors associated with the A terminals in, for example, switches 10 and 12 are "on". This is because the MOS transistor associated with the A terminals in switches 14 and 16 are then "off", and the MOS transistors associated with the B terminals in those switches will be "on". Consequently, the currents I0 and I1 in those switches will flow through track 52 rather than track 50. Since the state of the MOS transistors ("on" or "off") in switches 10, 12, 14 and 16 is determined by the logic states of the bits in the digit signals D0 to D3 (either 1 or 0) which represent the number to be converted, the magnitude of the current which flows through track 50 is varied with combinations of different logic states in the digit signals D0 through D3 provided at the outputs of digital register 44.

Since the current through track 50 varies with different ones of these combinations of digit signals used in forming various input binary numbers, the voltage drop across track resistance 50' in track 50 will vary with these combinations as well. This varying voltage drop will cause varying voltage values to appear at the A terminals of switches 10, 12, 14 and 16 (i.e., the magnitude of the voltage appearing at point 49 on track 50), dependent upon the combination of values of bits in the digit signals D0, D1, D2 and D3 selected. Since the voltage at terminals A of switches 10 through 16 varies with combinations of the binary digital data stored in digital signal register 44, and since, as stated above, V0 is comprised of fractions of the voltage appearing at the terminals of switches 10 through 16, a linearity error will appear in V0. A linearity error is the deviation in actual output from a straight line passing through the end points of the transfer characteristic of the D/A converter.

Similarly, the current flowing through track 52 to ground terminal 15 will vary with respect to the state of the MOS transistor ("on" or "off") associated with B terminals in switches 10, 12, 14 and 16. Since track 52 also has a track resistance 52' associated with it, the value of the voltage reference potential which appears at B terminals of switches 10, 12, 14 and 16 will vary with respect to the binary number digital data represented by logic signals D0, D1, D2 and D3 provided at the outputs of digital signal register 44. The varying reference potential appearing at B terminals of switches 10, 12, 14 and 16 will add to the linearity error as well. This is because when the transistors associated with the B terminals in switches 10, 12, 14 and 16 are "on", the voltage potential at the B terminals will vary and will add varying voltage components to V0 causing V0 to be inaccurate.

The error which appears in V0, which is caused by varying currents through track resistances 50' and 52' of tracks 50 and 52, which is in turn determined by combinations of the logic states of digit signals provided in digital signal register 44, is called linearity superposition error. Although the linearity errors associated with any one digit signal D0, D1, D2 and D3 can be trimmed arbitrarily close to zero by laser trimming of the corresponding one of 2R valued resistors 24, 28, 30 and 32, the linearity superposition errors remain.

For instance, the linearity error associated with bit D0, if D0 were treated as the only bit in the D/A converter, could be trimmed to as close to zero as desired by laser trimming the resistance of resistor 24, having nominally a resistance of 2R, since the track resistance could be taken into account when trimming 2R resistor 24. Similarly, the linearity error due to binary digital bit D1 could be trimmed very close to zero by laser trimming the resistance value of resistor 28, again of nominally resistance 2R, assuming bit D1 was the only bit in the D/A converter of FIG. 2. However, the linearity superposition error caused by the various combinations of logic states which could be provided as in digit signals D0 and D1 at the corresponding outputs of digital register 44 cannot be trimmed to zero because of the track resistance portions which are common to both of them.

The linearity superposition error in the D/A converter of FIG. 2 can be mathematically suggested using the circuit approximation of FIG. 2A. For simplicity, a D/A converter of only three bits capability is used in FIG. 2A with resistor 32 of FIG. 2 assumed open and resistor 42 shorted. A track resistance r is assumed for simplicity for both track resistance 50' in track 50 between true voltage reference node 48' and the A terminal of switch 12, and track resistance 52' in track 52 between true ground reference terminal 15 and the B terminal of switch 12. There is also assumed to be no track resistance between the A terminals of switches 12, 14 and 16 on track 50, or between the B terminals of switches 12, 14 and 16 on track 52. This assumption is made again for simplicity because the track resistance in this length of track is either negligable or can be adequately dealt with using the trimming techniques discussed above.

Additionally, switches 12, 14 and 16 are assumed to be ideal ($R_{ON}=0$). This assumption is reasonable since the voltage drops across switches 12, 14 and 16 can be made to be equal with respect to each switch in the D/A converter by scaling the length-to-width ratios of the MOS transistors used as switches in accord with the scaling of the currents chosen to pass therethrough. This keeps the "on" resistances proportional to the resistance effectively in series therewith to thereby minimize the trimming of such resistances and the area of such resistances which must be available for trimming.

As discussed above with respect to FIG. 2, the analog voltage V0 varies by fractions of the voltage appearing at the A terminals of switches 10, 12, 14 and 16, depending on the logic states in the corresponding digit signals D3 through D0. On this basis, for the similar three bit D/A converter shown in FIG. 2A, the sum of (i) the value of voltage V0 if the state of the digit logic signal D0 equals a one and the logic states in both of the remaining digit signals D1 and D2 equal a zero, plus (ii) the voltage value of V0 if the logic states in D0 and D1 each equal zero and that in D2 equals one, should equal the level of voltage V0 if both D0 and D2 have logic states of one and D1 has a logic state of zero. That is, the sum of the two voltages V0 developed in the first two conditions, where only one digit signal of the three has a value of one although a different digit signal in each condition, should equal the voltage value V0 developed in the further condition having both of these digit signals concurrently equal to one. In other words, $V0_{100}+V0_{001}$ should equal $V0_{101}$.

Using loop equations on the circuit of FIG. 2A with the switches connected appropriately, it is possible to determine the analog output voltage V0 corresponding to the three digit signal logic state value combinations or bit combinations in digit signals D0, D1 and D2 described above. These combinations again are 100, 001 and 101 for the digit signals being ordered D2, D1, D0. For digit signals logic state combination 101:

$$VOUT = VREF\left[\frac{280R + 203r}{448R + 406r}\right]$$

For digit signals logic state combination 100:

$$VOUT = VREF[\tfrac{1}{2}]$$

For digit signals logic state combination 001:

$$VOUT = VREF\left[\frac{8R + 21r}{64R + 42r}\right]$$

Therefore, linearity superposition error of code 101 is:

$$VOUT_{101} - VOUT_{100} - VOUT_{001} = VREF *$$

$$\frac{2(280R + 203r)(64R + 42r) - (448R + 406r)(64R + 42r) - 2(8R + 21r)(448R + 406r)}{2(64R + 42r)(448R + 406r)}$$

and it follows that:

$$VOUT_{100}+VOUT_{001} \neq VOUT_{101}$$

The linearity superposition error can be calculated in a similar fashion for any combination of bits in a D/A converter with any extension in the ladder network.

Elimination of the linearity superposition errors suggested in the above analysis for the circuit in FIG. 2A has been previously attempted. One attempt was to use very low resistance tracks for voltage and ground tracks 50 and 52, respectively. The use of these low resistance tracks would minimize track resistances 50' and 52' in tracks 50 and 52, respectively. Consequently, the linearity superposition errors would be lowered because the voltage drop across these track resistances, caused by varying currents in tracks 50 and 52, would decrease as the value of the track resistance decreased. However, without changing the length of the tracks or the resistivity of the material, the lowering of the resistance of the tracks requires the area of the tracks in a monolithic integrated circuit chip be increased. Consequently, this solution tends to require tracks 50 and 52 to take up an undesirable amount of area in a monolithic integrated circuit chip, thus increasing its cost.

Another method which has been previously used in an attempt to eliminate or reduce linearity superposition errors is to keep the length of the reference voltage tracks and ground tracks 50 and 52, respectively, as short as possible in the chip. By shortening the length of tracks 50 and 52, the resistance of the tracks can be decreased without changing the resistivity of the material or the area of the tracks. However, decisions such as chip connecting pin placement often determine where voltage reference node 48 and analog ground node 15 must be located. Consequently, tracks 50 and 52 cannot always be kept as short as desired, and the linearity superposition errors will then be too great to ignore in precision applications.

Although each of the above methods may be used with some success to reduce linearity superposition errors somewhat, neither of them can consistently reduce them to a point where it is not significant in precision applications.

SUMMARY OF THE INVENTION

The present invention provides a converting means for converting digit signals, each representing one of n-digits in binary numbers in a sequence thereof, into a corresponding analog signal. The analog signal so provided is comprised of a sum of selected fractions of a first reference voltage for a first reference voltage through use of a resistive network and a connected plurality of switching means. Interconnecting means each electrically connect a first switch input of one of the switching means to the first voltage reference by separately extending between them. Further interconnecting means each electrically connect a second switch input of one of the switching means to a second voltage reference by separately extending between them. Both the resistance in the interconnecting means and the series resistance it connects with in the resistive network are set to a total value which is substantially twice that of other resistances in the network. A method for doing this uses a laser to trim the resistances to such a total value.

BRIEF DESCRIPTION OF THE DRAWINGS

FIG. 2 shows another version of a D/A converter used in prior art;

FIG. 2A shows a version of a D/A converter similar to that of FIG. 2 for purposes of calculating the linearity superposition error;

FIG. 2B shows the switches used in the D/A converter of FIG. 2;

FIG. 3 shows a portion of the D/A converter of FIG. 2 implementing the present invention; and FIG. 3A shows a version of a D/A converter similar to that of FIG. 3 for purposes of calculating the linearity superposition error.

DETAILED DESCRIPTION OF THE PREFERRED EMBODIMENTS

Figure 1:
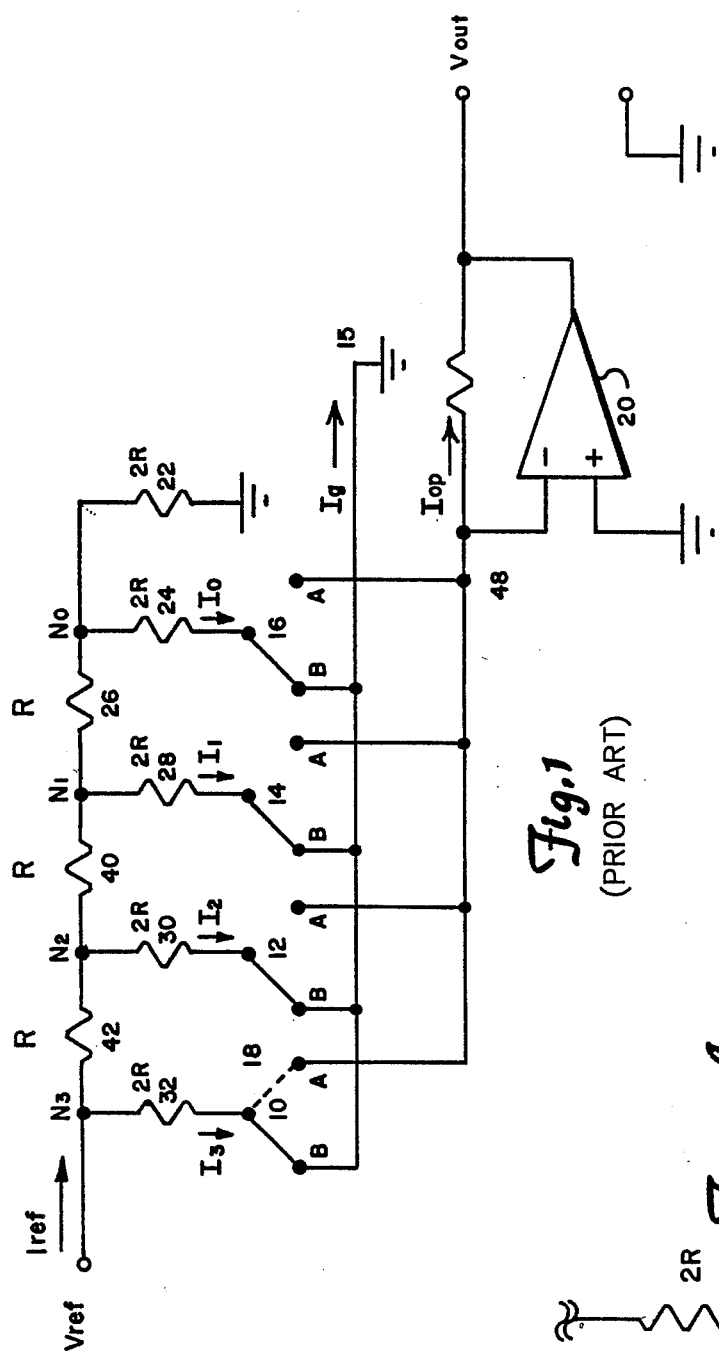
FIG. 1 shows a diagram of a portion of a D/A converter used in prior art.
Figure 1A:
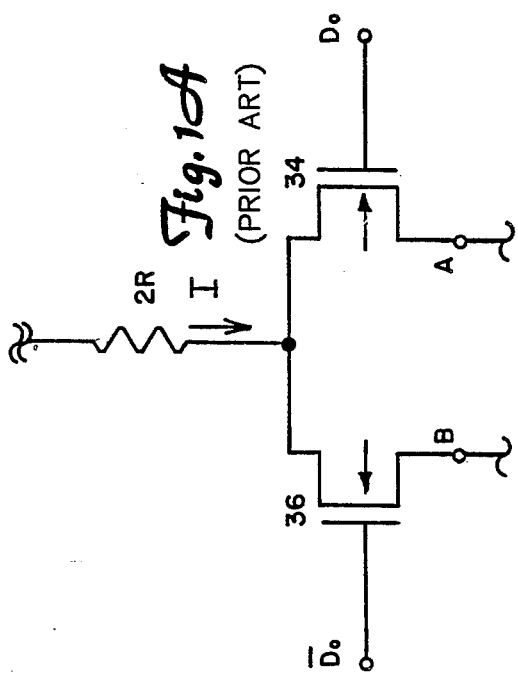
FIG. 1A shows one embodiment of switches used in the D/A converter of FIG. 1.

As previously discussed, the linearity superposition error in the D/A converter of FIG. 2 was caused by the track resistances 50' and 52' in tracks 50 and 52, respectively, being common to all of the switches 10, 12, 14 and 16, and by variations in current through these track resistances. Such current variations occur because of different binary numbers being converted to form an analog signal leading to different combinations of logic states in the digit signals representing these numbers. These current variations across the track resistances result in voltages appearing at the A and B terminals of switches 10, 12, 14 and 16 which vary from the reference voltage. Also, as indicated, due to the commonality of track resistances to switches 10, 12, 14 and 16 in causing such variations, the resulting error cannot be remedied by laser trimming techniques.

FIG. 3 shows a portion of a D/A converter, of the type shown in FIG. 2, embodying the present invention. The output amplifier circuit 54 and a portion of the reference voltage circuit 46, shown in FIG. 2, are not shown in FIG. 3 for purposes of simplicity. Additionally, the digital signal register 44, shown in FIG. 2, is not shown again in FIG. 3, as its purpose there would be the same and so is understood. However, the remaining structure of the D/A converter in FIG. 2 is identical to that in FIG. 3 except for voltage reference track 50 and ground track 52 which have been broken into four separated tracks, 54 through 60, and five separate tracks, 62 through 70, respectively.

As can be seen in more detail in FIG. 3, each B terminal (ground terminal) of switches 10, 12, 14 and 16 has its own ground track 70, 68, 66 and 64, respectively. Additionally, 2R resistor 22 has its own ground track 62. Similarly seen in FIG. 3, all the A terminals (voltage reference terminals) of switches 10, 12, 14 and 16 have their own voltage reference tracks 60, 58, 56 and 54, respectively. Each of the voltage reference tracks 54 through 60 extends from its corresponding switch terminal A on the switches 10 through 16 to reference voltage node 48. Similarly, each of ground tracks 62 through 70 extends from its corresponding terminal B on switches 10, 12, 14 or 16, or from 2R resistor 22, to ground reference node 15. Therefore, each terminal (A or B) on switches 10, 12, 14 and 16 has its own track with an individual track resistance inherent in it, these being track resistances 54' to 70'.

As a result, no track resistance is shared in the tracks extending from nodes 15 or 48 to their respective B or A terminals on switches 10, 12, 14 and 16. Therefore, any voltage drop which occurs across the track resistance in any of tracks 54 through 70 due to the state of the MOS transistors ("off" or "on") in any one switch 10, 12, 14 or 16, is entirely independent of the state of the MOS transistors in any other switch 10, 12, 14 or 16. Hence, any voltage drop which occurs across a track resistance in a track can be remedied through trimming as needed the resistance values of resistors 24, 28, 30 or 32 which are nominally of a resistance value equal to 2R.

For instance, recall that in the D/A converter of FIG. 2, if all switches were in the "1" position (i.e. D0, D1, D2 and D3 had logic values all equal to one), the effective reference voltages which appeared at terminals A of switches 10, 12, 14 and 16 would be different in value, due to the voltage drop across track resistance 50' in track 50 caused by currents flowing therein passed by each of these switches, than they would be if only switches 10 and 12, or some other selection of switches, were in the "1" position. This is because a different set of currents would flow through this latter selection of switches and thus through resistance 50'. Therefore, the value of the effective reference voltages appearing at A terminals of switches 10, 12, 14 and 16 varied with different combinations of logic states in the digit signals D0 through D3.

In the present invention shown in FIG. 3, however, the currents which flow through any of switches 10, 12, 14 or 16 each flow in a current path which carries only that current. None of the currents flowing through any others of the switches flows in that path no matter what changes occur in the states of switches 10, 12, 14 and 16. Since terminals A and B of switches 10, 12, 14 and 16 each have an individual one of tracks 54 through 70 extending therefrom to a corresponding one of nodes 15 and 48, and each track has a separate, inherent track resistance, a trimming procedure can be followed without concern that subsequent resistive value adjustments will affect previous resistive value adjustments made to other resistances associated with other switches. Therefore, the trimming techniques discussed above can be used on the 2R resistors 24, 28, 30 and 32 to account for its peculiar associated track resistance.

As done in FIG. 2A, the linearity superposition error which exists in the D/A converter of FIG. 3 can be approximated by using the circuit approximation shown in FIG. 3A. Assumptions are made here similar to those made in FIG. 2A, including the track resistances each having a value r, and the assumptions are valid for the same reasons.

As done above, using loop equations on the circuit of FIG. 3A with the switches in appropriate positions, the voltage V0 can be found if the logic states of digit signals D0, D1 and D2 are alternatively made equal to 100, 001 and 101 for these signals being ordered D2, D1, D0. Also, as discussed above, due to the voltage fraction addition nature of the operation of the D/A converter, the voltage V0 if digit signals D2, D1 and D0 have a logic state combination which equals 100, plus the voltage V0 if the state combination of digit signals D2, D1 and D0 equals 001 should equal the voltage level appearing at node V0 if the logic states combination of digit signals D2, D1 and D0 equal 101 (i.e. $VO_{100}+VO_{001}=VO_{101}$).

For digit signal logic state combination 101:

$$VOUT = VREF \left[ \frac{R(5R + 2r)(4R + r)}{(3R + r)(5R + 2r)(4R + r) - (2R + r)^2(7R + 2r)} \right]$$

For digit signal logic state combination 100:

$$VOUT = VREF \left[ \frac{R(5R + 2r)(4R + r) - R(2R + r)^2}{(3R + r)(5R + 2r)(4R + r) - (2R + r)^2(7R + 2r)} \right]$$

For digit signal logic state combination 001:

$$VOUT = VREF \left[ \frac{R(2R + r)^2}{(3R + r)(5R + 2r)(4R + r) - (2R + r)^2(7R + 2r)} \right]$$

Hence, one can see that combining these last three equations will show that $VOUT_{100}+VOUT_{001}=VOUT_{101}$. Therefore, no linearity superposition error exists in this approximation. As stated above, the same type of calculation can be made for any combination of bits in a D/A converter with any extension in the resistive ladder network maintaining the pattern shown.

Although the track resistances were each assumed to be equal to r, this was done just to reduce the size of the equations above. Differing values of track resistance from track to track still lead to the same result, i.e. that the linearity superposition error is eliminated. If the D/A converter of the present invention is fabricated in a silicon monolithic integrated circuit, the present invention may be utilized to effectively eliminate the linearity superposition error due to shared track resistance in the interconnection network on the silicon, or at least reduce it to an acceptable level in precision applications. The present invention does not take up as much chip area as the previously attempted solutions, nor do bonding considerations, which significantly limited at least some of the previously attempted solutions, hinder implementation of the present invention.

Some linearity superposition errors will still occur which are not capable of being remedied on the silicon. One example is wire bonding the voltage reference nodes 48 and ground node 15 out to landing pads on an integrated circuit package. However, this linearity superposition error may be minimized by using techniques such as double bonding or, alternatively, voltage buffering the reference and ground terminations. Therefore, the present invention eliminates a major source of linearity superposition error thereby enhancing the opportunity for high precision applications.

Although the present invention has been described with reference to preferred embodiments, workers skilled in the art will recognize that changes may be made in form and detail without departing from the spirit and scope of the invention.

What is claimed is:

1. Converting means for converting digital signals each representing one of n digits in a number in a sequence of numbers if such sequence is provided to the converting means at control inputs thereof, the converting means converting such digital signals into a corresponding analog signal to be provided at a voltage output of the converting means, the analog signal being comprised of a sum of selected fractions of a first reference voltage if provided at a first voltage reference terminating region of the converting means which is adapted to be electrically connected to a first voltage reference source, the converting means comprising:
   an R-2R resistive network, electrically connected to the voltage output, having a first plurality of resistances each with first and second terminating regions and each of substantially a first resistance value, this first plurality of resistances having each member thereof electrically connected in series with one another at such terminating regions, and with the R-2R resistive network also having a second plurality of resistances each with first and second terminating regions such that the first terminating region of each is electrically connected to a terminating region of at least one member of the first plurality of resistances and each having substantially a second resistance value;

a plurality of switching means each consisting of a switch output and first, second, third and fourth switch inputs such that signals on the third and fourth inputs of each can selectively electrically connect one of the first and second inputs thereof to the output thereof, the switch output of each being electrically connected to a second terminating region of a corresponding one of the second plurality of resistances, the third and fourth switch inputs of each being electrically connected to selected ones of the converting means control inputs;

a plurality of conductive first interconnecting means each electrically connecting a first switch input of one of the plurality of switching means to the first voltage reference terminating region by separately extending therebetween; and a plurality of conductive second interconnecting means each electrically connecting a second switch input of one of the plurality of switching means to a second voltage reference terminating region, adapted for electrical connection to a second reference voltage source, by separately extending therebetween.

2. The converting means of claim 1 wherein a value of resistance comprised of the sum of the resistance value of a resistance in said second plurality of resistances plus the resistance value of a selected one of the first and second interconnecting means connected to the same one of said plurality of switching means is adjustable in value through material removal to a resistance value for this sum that is substantially twice the first resistance value.

3. The converter means of claim 1 wherein the second resistance value is twice that of the first resistance value.

4. The converting means of claim 2 wherein each of said plurality of switching means comprises MOS field-effect transistors.

5. The converting means of claim 2 wherein the analog signal is buffered by electrically connecting the voltage output to an input of an operational amplifier which provides a buffered analog signal at its output.

6. The converter means of claim 2 wherein the second resistance value is twice that of the first resistance value.

7. The converting means of claim 4 wherein each switching means comprises:

first and second MOS field-effect transistors each having terminating regions serving as a source and drain thereof with one terminating region of each being electrically connected to one another and comprising the switch output of the switching means, the gate region of the first MOS field-effect transistor comprising the third input of the switching means, and the gate region of the second MOS field-effect transistor comprising the fourth input of the switching means, and with the remaining terminating region of the first MOS field-effect transistor serving as the first input of the switching means, and the remaining terminating region of the second MOS field-effect transistor serving as the second input of the switching means.

8. The converting means of claim 4 wherein each switching means comprises complementary MOS field-effect transistors each switching means having a p-channel and an n-channel MOS field-effect transister wherein the gate regions of each MOS field-effect transistor are electrically connected to one another thereby combining the third and fourth inputs to the switching means to comprise the control input of the converting means, the drain regions of each MOS field-effect transistor comprising the switch output of the switching means, and the source regions of the first and second complementary MOS field-effect transistors comprising the first and second inputs to the switching means, respectively.

9. A method of reducing linearity superposition error in a D/A converter of the type having an R-2R resistive network electrically connected to a voltage output, and having a plurality of switching means which selectively electrically connect resistances in the R-2R resistive network to first and second reference voltage terminating regions, the method comprising:

connecting first switch inputs in each of the plurality of switching means to the first reference voltage terminating region using one of a plurality of conductive first interconnecting means by separately extending therebetween;

connecting second switch inputs in each of the plurality of switching means to the second reference voltage terminating region using one of a plurality of conductive second interconnecting means by separately extending directly therebetween; and adjusting the sum of the resistances values of each first and second interconnecting means and the resistance in the R-2R network to which it is connected to be substantially twice the resistance value of a plurality of resistances also in the R-2R network.

* * * * *